(12) United States Patent
Jeong et al.

(10) Patent No.: US 7,326,625 B2
(45) Date of Patent: Feb. 5, 2008

(54) TRENCH STRUCTURE HAVING A VOID AND INDUCTOR INCLUDING THE TRENCH STRUCTURE

(75) Inventors: Joo-Hyun Jeong, Seoul (KR); Chul-Ho Chung, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 158 days.

(21) Appl. No.: 11/052,552

(22) Filed: Feb. 7, 2005

(65) Prior Publication Data
US 2005/0176215 A1    Aug. 11, 2005

(30) Foreign Application Priority Data
Feb. 9, 2004    (KR) .................... 10-2004-0008279

(51) Int. Cl.
*H01L 21/20*    (2006.01)
(52) U.S. Cl. ............................ 438/386; 257/E21.545
(58) Field of Classification Search ................ 438/242, 438/248, 421
See application file for complete search history.

(56) References Cited

U.S. PATENT DOCUMENTS 5,679,599 A * 10/1997 Mehta ...................... 438/425

6,590,200 B1    7/2003 Ludwig et al. .......... 250/222.2
2004/0147093 A1 *  7/2004 Marty et al. ................ 438/442

FOREIGN PATENT DOCUMENTS

| JP | 11-243142 | 9/1999 |
| JP | 11-284062 | 10/1999 |
| KR | 03-46919 | 6/2003 |

* cited by examiner

*Primary Examiner*—Scott B. Geyer
*Assistant Examiner*—Elias Ullah
(74) *Attorney, Agent, or Firm*—Mills & Onello LLP

(57) ABSTRACT

In a method of forming a trench structure having a wide void therein, a first trench having a first width and a first depth is formed in a substrate. The first trench is filled with a first insulation layer pattern defining the void in the first trench. A second trench is formed on the first trench. The second trench has a second width wider than the first width and a second depth shallower than the first depth. The second trench is filled with a second insulation layer pattern. After an insulating interlayer on the substrate including the first and second trenches, a conductive line is formed on a portion of the insulating interlayer where the second trench is positioned so that an inductor is formed over the trench structure.

11 Claims, 14 Drawing Sheets

US 7,326,625 B2

TRENCH STRUCTURE HAVING A VOID AND INDUCTOR INCLUDING THE TRENCH STRUCTURE

CROSS REFERENCE TO RELATED APPLICATION

This application claims priority under 35 USC § 119 to Korean Patent Application No. 2004-8279, filed on Feb. 9, 2004, the disclosure of which is incorporated herein by reference in its entirety.

BACKGROUND OF THE INVENTION

1. Field of the Invention

The present invention relates to a trench structure having a void therein and an inductor including the trench structure. More particularly, the present invention relates to a trench structure including a deep trench having a wide void therein by employing a selective epitaxial growth process and an inductor including the trench structure.

2. Description of the Related Art

An inductor generally occupies a relatively large area of a substrate as compared to the area occupied by other radio frequency (RF) passive devices formed on a substrate. The inductor typically has a large impact on the overall electrical performance characteristics of an electric or electronic apparatus including the inductor in a high-frequency design. Since the inductance of the inductor increases in proportion to signal frequency, the inductor is useful for remove the noise of a signal in a predetermined frequency band. The operational characteristics of inductors become more important as the electric or electronic apparatus utilizing such inductors become further integrated, requiring reduced size, lighter weight, more rapid response, etc. Thus, optimal inductor design requires light-weight construction, reduced size, high self-resonant frequency, high inductance, high quality factor, etc. In general, the most important characteristics of the inductor are inductance (L) value and quality factor (Q-factor). In view of this, integrated inductors include a metal line having relatively low resistance and preferably exhibit reduced substrate loss.

Example methods for forming conventional inductors are disclosed in U.S. Pat. No. 6,590,200 and Korean Laid Open Patent Publication No. 2003-46919.

FIGS. 1A to 1E are cross sectional views illustrating a method for manufacturing a conventional inductor.

Referring to FIG. 1A, after an epitaxial silicon layer 10 is formed on a silicon substrate 1 having an ion implantation region 5, a polish stop layer 15 is formed on a portion of the epitaxial silicon layer 10 where the ion implantation region 5 is positioned. A shallow trench 20 is formed on another portion of the epitaxial silicon layer on which the polish stop layer 15 is not formed. Thus, the shallow trench 20 does not overlap with the ion implantation region 5.

Referring to FIG. 1B, a photoresist pattern 25 is formed on the polish stop layer 15 and the epitaxial silicon layer 10 having the shallow trench 20 formed thereon. The photoresist pattern 25 has a first opening 30 that partially exposes the epitaxial silicon layer 10 where the shallow trench 20 is positioned.

The exposed portion of the epitaxial silicon layer 10 is etched using the photoresist pattern 25 as an etching mask to thereby form a second opening 35 that partially exposes the silicon substrate 1 beneath the epitaxial silicon layer 10.

Referring to FIG. 1C, after the photoresist pattern 25 is removed, a silicon oxide layer 40 is formed on the exposed portion of the silicon substrate 1, the epitaxial silicon layer 10, and the polish stop layer 15. The silicon oxide layer 40 fills up the second opening 35 formed through the epitaxial silicon layer 10.

Referring to FIG. 1D, the silicon oxide layer 40 is polished by a chemical mechanical polishing (CMP) process until the polish stop layer 15 is exposed, thereby forming a planarized silicon oxide layer 45. In the CMP process, the polish stop layer 15 protects the epitaxial silicon layer 10 formed on the ion implantation region 5.

Referring to FIG. 1E, after the polish stop layer 15 is removed to partially expose the epitaxial silicon layer 10, an insulating interlayer 50 is formed on the exposed portion of the epitaxial silicon layer 10 and the planarized silicon oxide layer 45.

An inductor 55 is formed on the insulation interlayer 50 using a conductive material such as metal. Here, the inductor 55 is formed on a portion of the insulating interlayer 50 where the planarized silicon oxide layer 45 is positioned. Because the inductor 55 is positioned over the portion of the silicon substrate 1 exposed through the second opening 35, the inductor 55 does not overlap the epitaxial silicon layer 10.

However, in the method of manufacturing the conventional inductor, the quality factor of the inductor may be reduced due to loss that occurs through the substrate because the inductor is formed on the silicon substrate, which is uniform below the inductor. That is, since the conventional inductor is formed over a uniform portion of the silicon substrate where the shallow trench is positioned, substrate loss can occur due to the uniformity of the substrate. Particularly, substrate-based loss is greatly increased in the high-frequency band, which can greatly reduce the quality factor of the conventional inductor in the high frequency band.

SUMMARY OF THE INVENTION

The present invention provides a trench structure including a deep trench having a wide void therein.

The present invention also provides a method of forming a trench structure including a deep trench having a wide void therein by a selective epitaxial growth process.

The present invention also provides an inductor including a trench structure that has a deep trench including a wide void so as to improve a quality factor thereof.

The present invention also provides a method of manufacturing an inductor including a trench structure that has a deep trench including a wide void by employing a selective epitaxial growth process.

In accordance with one aspect of the present invention, there is provided a trench structure including a deep trench having a first width and a first depth, and a shallow trench having a second width and a second depth. The second width is substantially wider than the first width and the second depth is substantially shallower than the first depth. The deep trench is formed in a substrate and is filled with a first insulation layer pattern defining a void in the deep trench. The shallow trench is formed on the deep trench and is filled with a second insulation layer pattern.

In one embodiment, a ratio between the first width and a width of the void is in a range of about 1:0.6 to 0.9, a ratio between the first width and the first depth is in a range of more than about 1:4, and a ratio between the second width and the second depth is in a range of about 1:0.1 to 0.3. In addition, a ratio between of the first width and the second width is about 1:1.0 to 1.5 and a ratio between the first depth and the second depth is in a range of about 1:0.4 to 0.7.

In another embodiment, the first insulation layer pattern includes a first oxide layer pattern formed on a sidewall of the deep trench, a first nitride layer pattern formed on the first oxide layer pattern to partially fill up the deep trench, and a second oxide layer pattern formed on the first nitride layer pattern to cover a top portion of the deep trench. The second oxide layer pattern defines the void in the deep trench with the first nitride layer pattern. The second insulation layer pattern includes a third oxide layer pattern formed on a sidewall of the shallow trench, a second nitride layer pattern formed on the third oxide layer pattern and the second oxide layer pattern, a fourth oxide layer pattern formed on the second nitride layer pattern, and a fifth oxide layer pattern formed on the fourth oxide layer pattern to fill up the shallow trench.

In accordance with another aspect of the present invention, there is provided a method of forming a trench structure. In the method, a deep trench having a first width and a first depth is formed on a substrate. A void is formed in the deep trench by filling the deep trench with a first insulation layer pattern in a manner that defines a void in the deep trench. A shallow trench is formed on the deep trench. The shallow trench has a second width substantially wider than the first width and a second depth substantially shallower than the first depth. The shallow trench is filled with a second insulation layer pattern.

In one embodiment, forming the deep trench comprises: forming a pad oxide layer pattern on the substrate; forming a first nitride layer pattern on the pad oxide layer pattern; forming a first oxide layer pattern on the first nitride layer pattern; partially etching the substrate using the first oxide layer pattern, the first nitride layer pattern and the pad oxide layer pattern as etching masks; and removing the first oxide layer pattern.

In another embodiment, forming the deep trench further comprises: sequentially forming a pad oxide layer, a first nitride layer and a first oxide layer on the substrate; forming a first photoresist pattern on the first oxide layer, the first photoresist pattern including an opening having the first width, through which the first oxide layer is partially exposed; and sequentially etching the first oxide layer, the first nitride layer and the pad oxide layer using the first photoresist pattern as an etching mask to form the pad oxide layer pattern, the first nitride layer pattern and the first oxide layer pattern on the substrate.

In another embodiment, forming the void in the deep trench comprises: forming a second oxide layer pattern on a sidewall of the deep trench; forming a second nitride layer pattern on the second oxide layer pattern to form an opening in the deep trench; and forming a third oxide layer pattern on the second nitride layer pattern to complete the void by covering a top portion of the opening. In addition, a channel stop region is formed at a portion of the substrate beneath the deep trench, for example, using elements in Group III as impurities.

In another embodiment, forming the void in the deep trench further comprises: forming a second nitride layer on the second oxide layer pattern and the first nitride layer pattern; over-etching the second nitride layer to form the second nitride layer pattern that partially exposes a portion of the substrate; forming an epitaxial silicon layer from the exposed portion of the substrate; forming a third oxide layer on the epitaxial silicon layer and the second nitride layer pattern; and etching the third oxide layer to form the third oxide layer pattern that covers a top portion of the opening.

The second nitride layer is etched by an etch back process and the third oxide layer is etched by a chemical mechanical polishing process. The epitaxial silicon layer grows from the exposed portion of the substrate in a direction parallel to the substrate so that the opening is partially closed by the epitaxial silicon layer.

In another embodiment, forming the shallow trench comprises: forming a second photoresist pattern on the third oxide layer pattern and the first nitride layer pattern; and partially etching the first nitride layer pattern, the third oxide layer pattern, the pad oxide layer pattern, the epitaxial silicon layer and the substrate using the second photoresist pattern as an etching mask.

In another embodiment, an anti reflective layer is formed between the third oxide layer pattern and the second photoresist pattern and between the first nitride layer pattern and the second photoresist pattern.

In another embodiment, filling up the shallow trench with the second insulation layer pattern comprises: forming a fourth oxide layer pattern on a sidewall of the shallow trench; forming a third nitride layer pattern on the fourth oxide layer pattern and the third oxide layer pattern; forming a fifth oxide layer pattern on the third nitride layer pattern; and forming a sixth oxide layer pattern on the fifth oxide layer pattern to fill up the shallow trench. Filling up the shallow trench with the second insulation layer pattern further comprises: sequentially forming a third nitride layer, a fifth oxide layer, a sixth oxide layer and a seventh oxide layer on the fourth oxide layer pattern and the third oxide layer pattern; and etching the seventh oxide layer, the sixth oxide layer, the fifth oxide layer and the third nitride layer until the pad oxide layer pattern is exposed to form the third nitride layer pattern, the fifth oxide layer pattern and the sixth oxide layer pattern in the shallow trench.

In accordance with another aspect of the present invention, there is provided an inductor including a semiconductor substrate having a plurality of trench structures, at least one insulating interlayer formed on the semiconductor substrate and a conductive line formed on a portion of the insulating interlayer positioned over the trench structures. Each of the trench structures includes a first trench having a first width and a first depth and a second trench having a second width substantially wider than the first width and a second depth substantially shallower than the first depth. The first trenches are filled with first insulation layer patterns defining voids in the first trenches and the second trenches are filled with second insulation layer patterns.

In one embodiment, the inductor further comprises a contact region formed at a portion of the semiconductor substrate adjacent to one of the trench structures and a contact contacting the contact region through the insulating interlayer. A conductive pattern is formed between the contact and the insulating interlayer. The semiconductor substrate comprises a P type silicon substrate and the contact region has a $P^+$ type.

In another embodiment, the trench structure adjacent to the contact region is spaced apart from the conductive line by an interval about 3 to 9 times larger than the first depth.

In accordance with another aspect of the present invention, there is provided a method of manufacturing an inductor. In the method of manufacturing the inductor, after a plurality of first trenches, each having a first width and a first depth, are formed on a semiconductor substrate, the first trenches are filled with first insulation layer patterns to form voids in the first trenches, respectively. A plurality of second trenches is formed on the first trenches. Each of the second trenches has a second width substantially wider than the first width and a second depth substantially shallower than the first depth. The second trenches are filled with second insulation layer patterns. At least one insulating interlayer is formed on the semiconductor substrate including the first and second trenches. Then, a conductive line is formed on a portion of the insulating interlayer where the second trenches are positioned.

In one embodiment, a contact region is formed at a portion of the semiconductor substrate adjacent to one of the first trench by an ion implantation process. A contact is formed that contacts the contact region through the insulating interlayer.

In another embodiment, a conductive pattern is formed between the contact and the insulating interlayer.

According to the present invention, a deep trench having a wide void therein is formed on a substrate by a selective epitaxial growth (SEG) process. For example, the deep trench has a depth of more than about 8 μm. Since an inductor is formed over the substrate where a trench structure including a plurality of the deep trenches and a plurality of shallow trenches is formed, the inductor exhibits an improved quality factor. Particularly, the inductor exhibits greatly improved quality factor in a high frequency band of operation. Additionally, the quality factor of the inductor is maximized by advantageously adjusting an interval between the trench structure and the inductor.

BRIEF DESCRIPTION OF THE DRAWINGS

The above and other features and advantages of the invention will become readily apparent by reference to the following detailed description when considered in conjunction with the accompanying drawings wherein.

DETAILED DESCRIPTION OF THE INVENTION

Figure 1A:
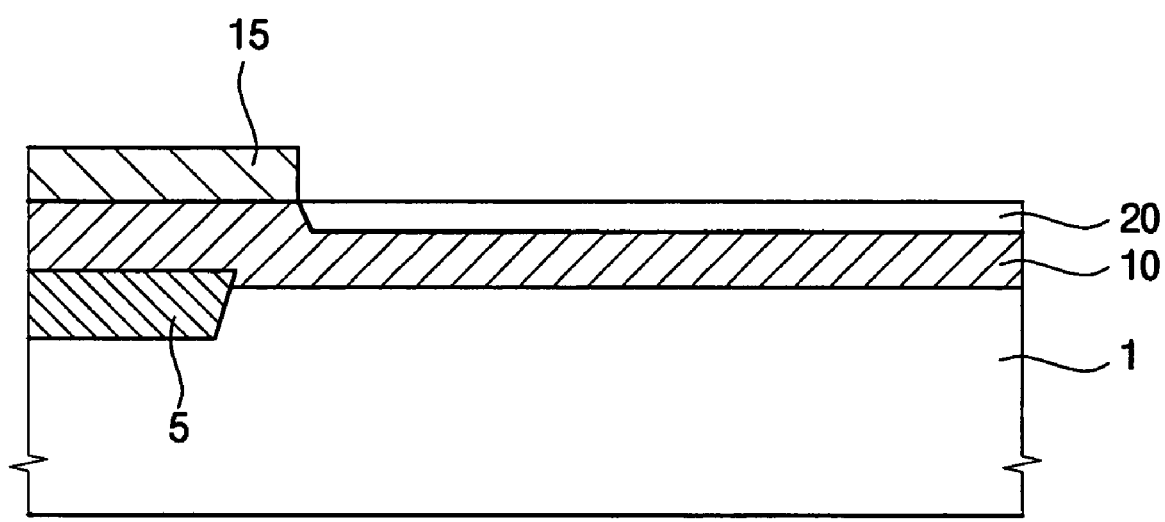
FIGS. 1A to 1E are cross sectional views illustrating a method of manufacturing a conventional inductor.
Figure 1B:
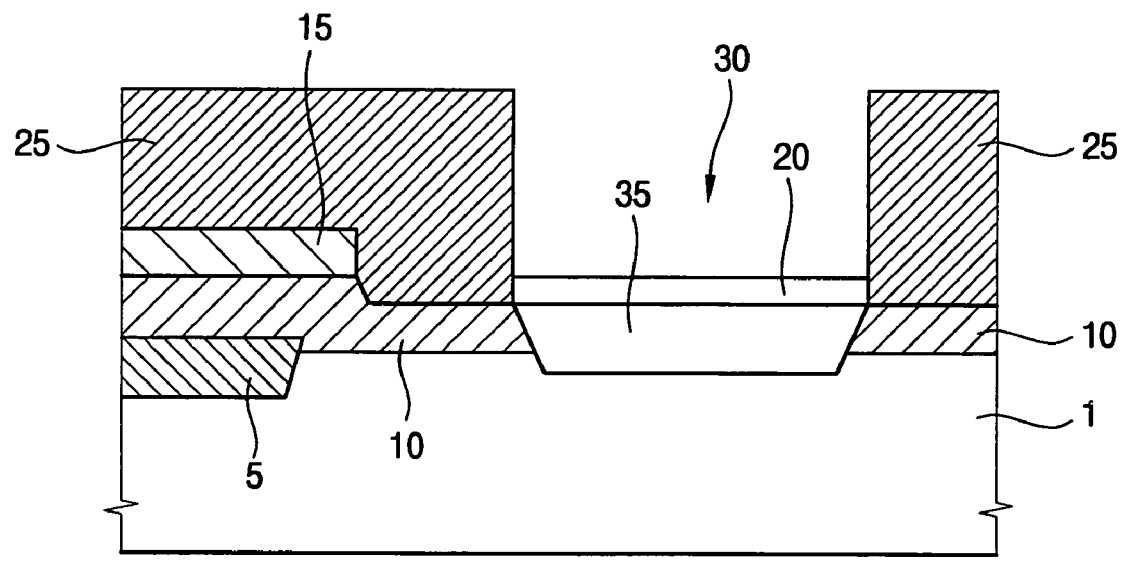
Figure 1C:
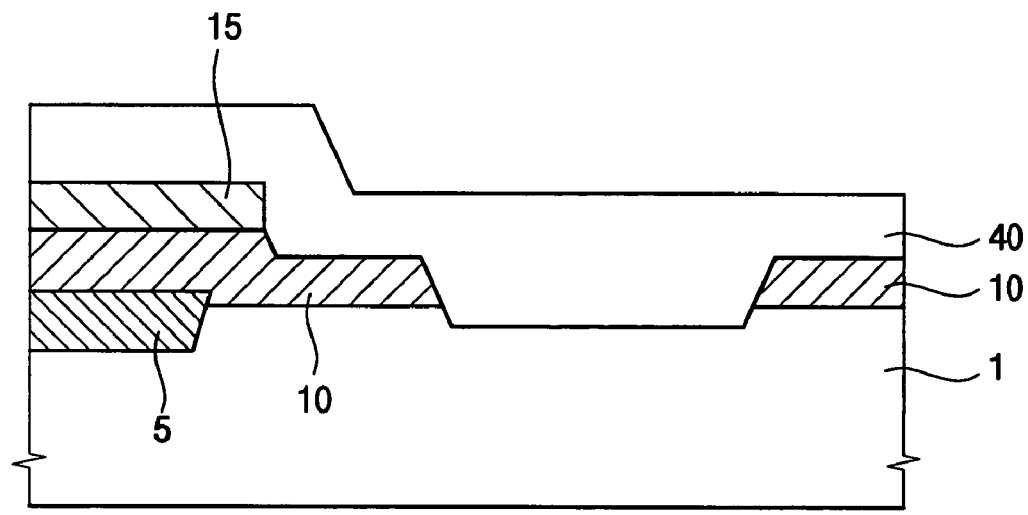
Figure 1D:
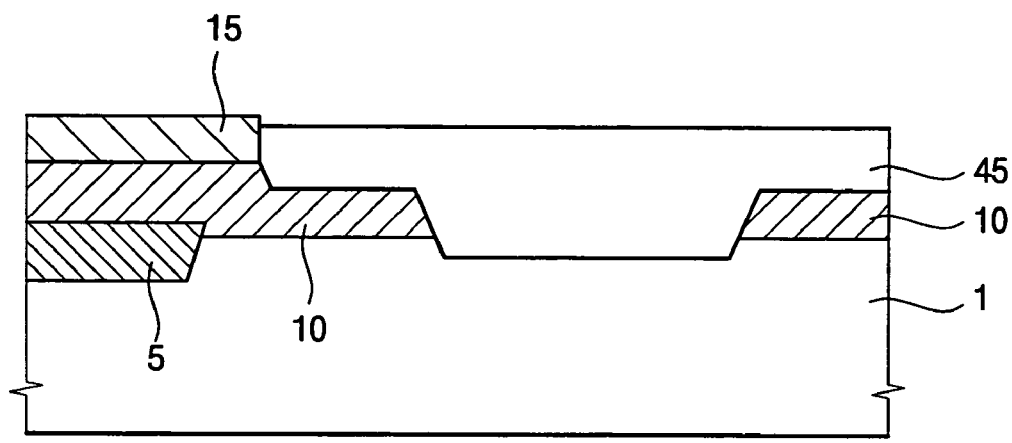
Figure 1E:
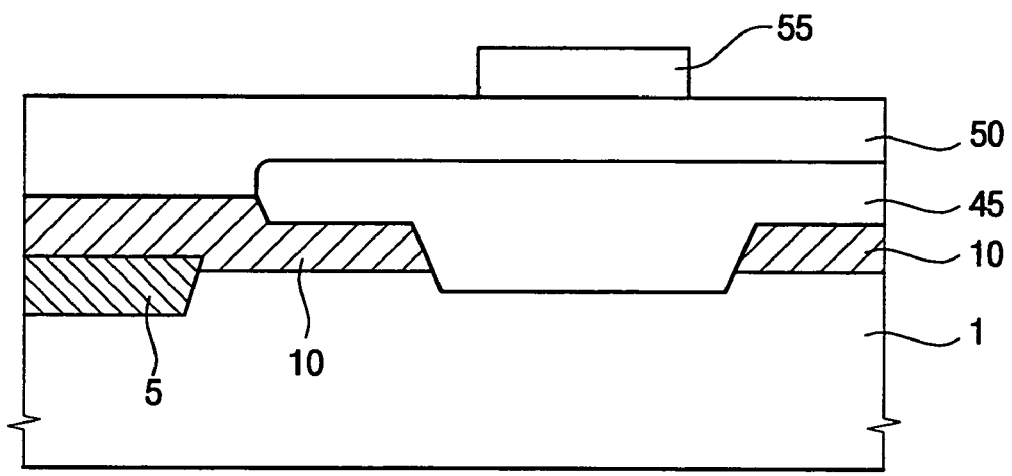

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to similar or identical elements throughout. It will be understood that when an element such as a layer, region or substrate is referred to as being "on" or "onto" another element, it can be directly on the other element or intervening elements may also be present.

FIGS. 2A to 2M are cross sectional views illustrating a method of forming a trench structure having a wide void in accordance with one embodiment of the present invention.

Figure 2A:
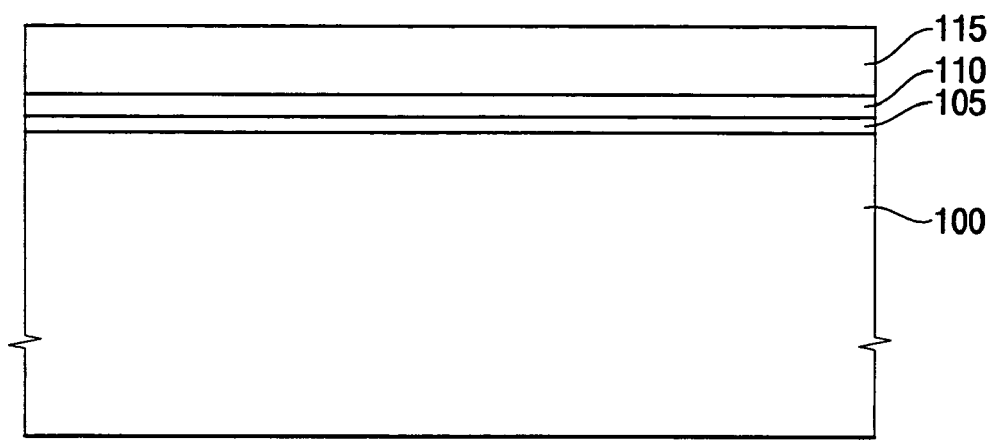
FIGS. 2A to 2M are cross sectional views illustrating a method of forming a trench structure having a wide void on a substrate in accordance with one embodiment of the present invention.

Referring to FIG. 2A, a pad oxide layer 105 is formed on a semiconductor substrate 100. The pad oxide layer 105 may have a thickness of about 50 to about 150 Å. Here, the semiconductor substrate 100 may be a P type silicon substrate. The pad oxide layer 105 may be formed by a thermal oxidation process, a local oxidation of silicon (LOCOS) process or a chemical vapor deposition (CVD) process. For example, the pad oxide layer 105 is formed by the thermal oxidation process to have a thickness of about 110 Å measured from an upper face of the semiconductor substrate 100.

A first nitride layer 110 is formed on the pad oxide layer 105. The first nitride layer 110 may have a thickness of about 800 to about 1,200 Å based on an upper face of the pad oxide layer 105. The first nitride layer 110 may include silicon nitride (SiN). For example, the first nitride layer 110 has a thickness of about 1,000 Å measured from the upper face of the pad oxide layer 105.

A first oxide layer 115 is formed on the first nitride layer 110. The first oxide layer 115 may have a thickness about 3,500 to about 4,500 Å. The first oxide layer 115 may be formed by a chemical vapor deposition process, a plasma enhanced-chemical vapor deposition (PE-CVD) process or a high density plasma-chemical vapor deposition (HDP-CVD) process. For example, the first oxide layer 115 is formed on the first nitride layer 110 by the PE-CVD process so that the first oxide layer 115 has a thickness of about 4,000 Å measured from an upper face of the first nitride layer 110. Thus, in one embodiment, the thickness ratio among the first nitride layer 110, the first oxide layer 115 and the pad oxide layer 105 is in a range of about 1:5 to 25:23 to 90.

Figure 2B:
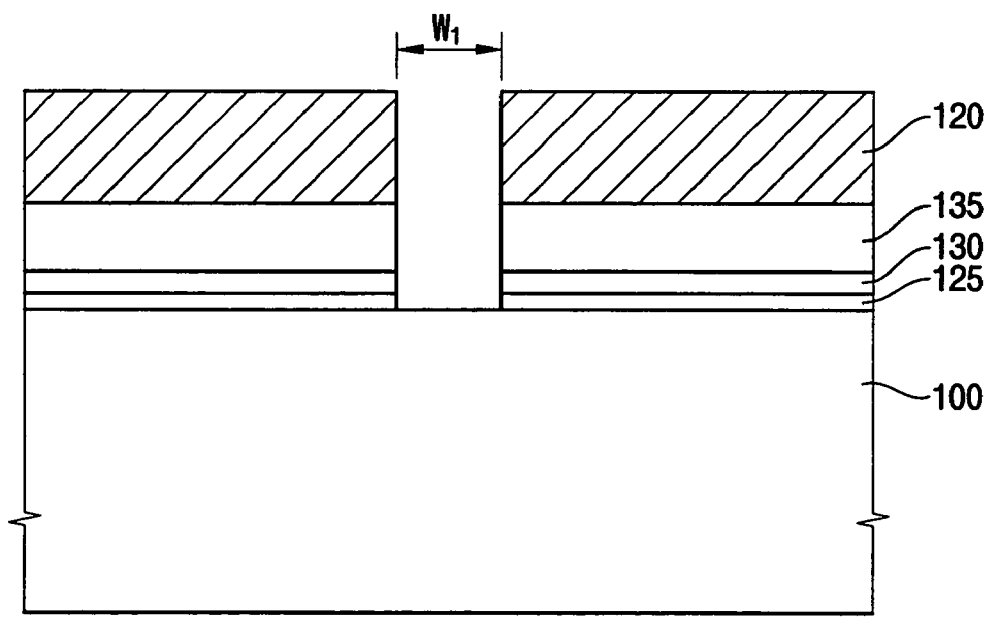

Referring to FIG. 2B, after a first photoresist film is formed on the first oxide layer 115, the first photoresist film is exposed and developed to thereby form a first photoresist pattern 120 on the first oxide layer 115. The first photoresist pattern 120 exposes a first portion of the semiconductor substrate 100 where a deep trench 140 (referred to as a first trench) will be formed (see FIG. 2C).

The first oxide layer 115, the first nitride layer 110 and the pad oxide layer 105 are partially etched using the first photoresist pattern 120 as an etching mask, thereby sequentially forming a pad oxide layer pattern 125, a first nitride layer pattern 130 and a first oxide layer pattern 135 on the semiconductor substrate 100. When the first oxide layer 115, the first nitride layer 110 and the pad oxide layer 105 are partially etched, the first portion of the semiconductor substrate 100 is exposed. The exposed first portion of the semiconductor substrate 100 may have, in one embodiment, a width $W_1$ of about 1.4 to about 1.8 μm. For example, the exposed first portion of the semiconductor substrate 100 has a width $W_1$ of about 1.6 μm. Accordingly, the deep trench 140 formed at the exposed first portion of the substrate 100 also has a first width $W_1$ of about 1.4 to about 1.8 μm. For example, the deep trench 140 has a first width $W_1$ of about 1.6 μm.

Figure 2C:
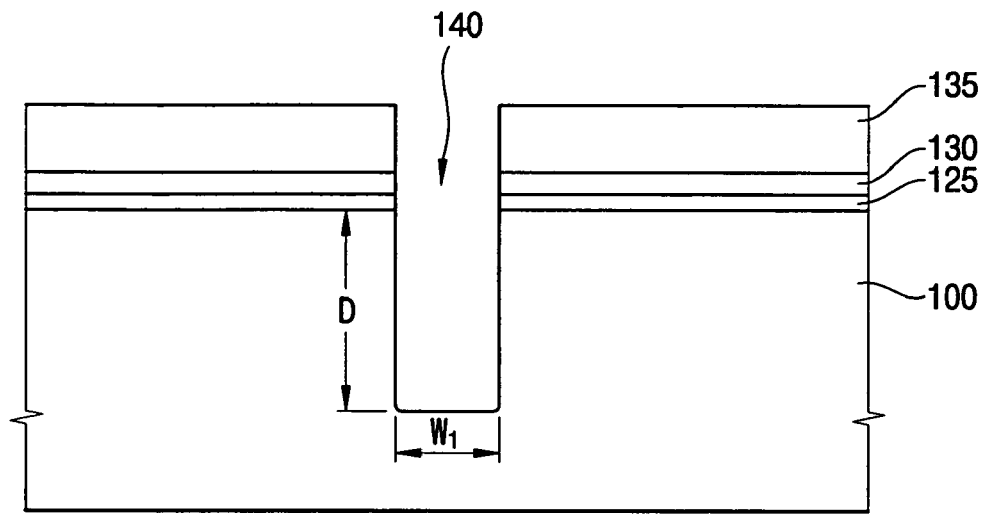

Referring to FIG. 2C, after the first photoresist pattern 120 is removed by an ashing and/or a stripping process, the exposed first portion of the substrate 100 is etched using the first oxide layer pattern 135, the first nitride layer pattern 130 and the pad oxide layer pattern 125 as etching masks. As a result, the deep trench 140 having a first depth D is formed at the exposed first portion of the substrate 100. For example, the first depth D of the deep trench 140 is more than about 8 μm. Thus, the ratio between the first width $W_1$ and the first depth D is more than about 1:4.

In one embodiment of the present invention, the first photoresist pattern 120 may be removed during the etching process used for forming the deep trench 140, and thus an additional step for removing the first photoresist pattern 120 is not required.

Figure 2D:
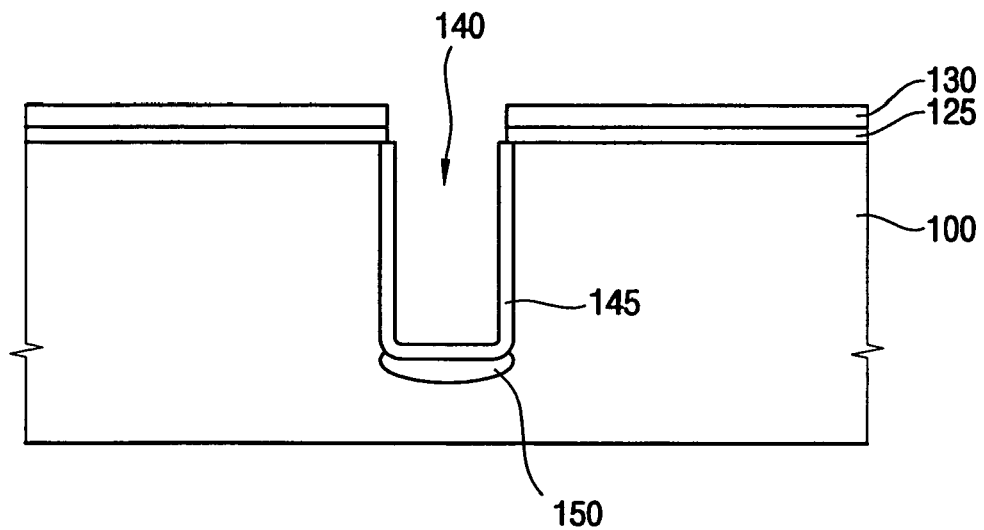

Referring to FIG. 2D, the first oxide layer pattern 135 is removed by a dry etch process or a wet etch process. Then, a second oxide layer pattern 145 is formed on an inner sidewall of the deep trench 140. The second oxide layer pattern 145 may be formed, for example, by a thermal oxidation process or a chemical vapor deposition process. The second oxide layer pattern 145 may have a thickness of about 300 to about 700 Å. For example, the second oxide layer pattern 145 is formed on the inner sidewall of the deep trench 140 by the thermal oxidation process to have a thickness of about 500 Å.

A channel stop region 150 is formed beneath a bottom portion of the deep trench 140 by an ion implantation process. In particular, elements in Group III, for example, boron (B), gallium (Ga) or indium (In), are implanted as impurities into a second portion of the substrate 100 beneath the deep trench 140 with an energy of about 20 to about 40 KeV. Therefore, the channel stop region 150 is formed at the second portion of the substrate 100 beneath the deep trench 140. Here, the concentration of the impurities may be in a range of about $2.0 \times 10^{13}$ to about $4.0 \times 10^{13}$ atoms/cm². For example, the elements in Group III are implanted to form the channel stop region 150 with an energy of about 30 KeV so that the concentration of the impurities is about $3.0 \times 10^{13}$ atoms/cm². The implantation angle of the impurities is substantially about 0° relative to the semiconductor substrate 100. That is, the impurities are implanted into the second portion of the substrate 100 along a direction substantially perpendicular to the substrate 100 to thereby form the channel stop region 150 at the second portion of the substrate 100.

Figure 2E:
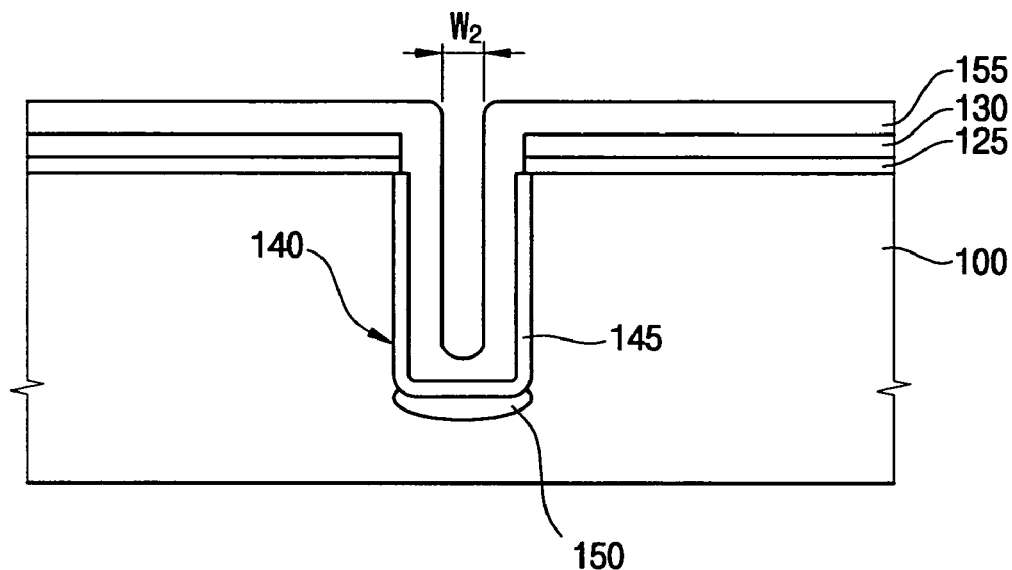

Referring to FIG. 2E, a second nitride layer 155 may be formed on the second oxide layer pattern 145 and the first nitride layer pattern 130. Particularly, the second nitride layer 155 is continuously formed on upper and side faces of the first nitride layer pattern 130, on a side face of the pad oxide layer pattern 125 and on the second oxide layer pattern 145. The second nitride layer 155 may have a thickness of about 0.1 to about 0.3 μm based on an upper face of the second oxide layer pattern 145. The second nitride layer 155 may be formed using silicon nitride by a chemical vapor deposition process. For example, the second nitride layer 155 has a thickness of about 0.2 μm measured from the upper face of the second oxide layer pattern 145. Because the second nitride layer 155 is formed on the second oxide layer pattern 145 positioned on the sidewall of the deep trench 140, the first width $W_1$ of the deep trench 140 decreases by twice the thickness of the second nitride layer 155. That is, the second nitride layer 155 is formed on the inner sidewall of the deep trench 140, the deep trench 140 may have a second width $W_2$ of about 1.0 to about 1.6 μm reduced by twice the thickness of the second nitride layer 155 in comparison with the first width $W_1$. For example, following application of the second nitride layer 155, the second width $W_2$ of the deep trench 140 is about 1.2 μm. Thus, the ratio of the first width $W_1$ relative to the second width $W_2$ may be about 1:0.6 to 0.9. For example, the ratio between the first width $W_1$ and the second width $W_2$ is about 1:0.75.

Figure 2F:
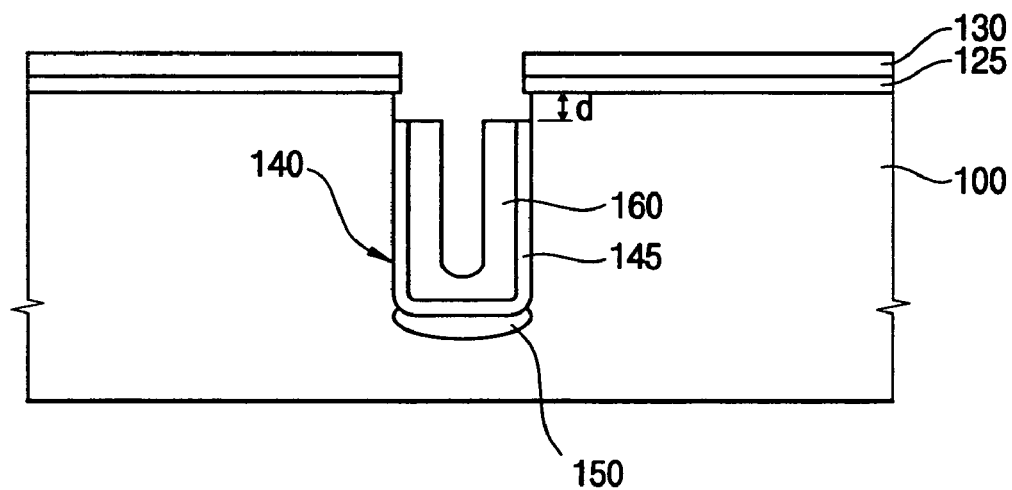

Referring to FIG. 2F, the second nitride layer 155 formed on the first nitride layer pattern is etched to thereby form a second nitride layer pattern 160 on the inner sidewall of the deep trench 140. To sequentially form an epitaxial silicon layer 165 (see FIG. 2G), the second nitride layer 155 is over-etched by a depth d of about 0.1 to about 0.2 μm measured from the upper face of the substrate 100. For example, the second nitride layer 155 is over-etched by a depth d of about 0.15 μm measured from the upper face of the substrate 100. Here, an upper portion of the second oxide layer pattern 145 is simultaneously etched by the depth d of about 0.1 to about 0.2 μm so that an upper sidewall of the deep trench 140 is exposed. That is, a portion of the semiconductor substrate 100 is exposed after the second oxide layer pattern 145 and the second nitride layer pattern 160 are formed on the sidewall of the deep trench 140. Because the upper portion of the inner sidewall of the deep trench 140 is exposed, the epitaxial silicon layer 165 is sequentially grown from an exposed portion of the sidewall of the deep trench 140. For example, the second nitride layer 155 and the second oxide layer pattern 145 are etched by an etch back process to form the second nitride layer pattern 160 on the second oxide layer pattern 145.

Figure 2G:
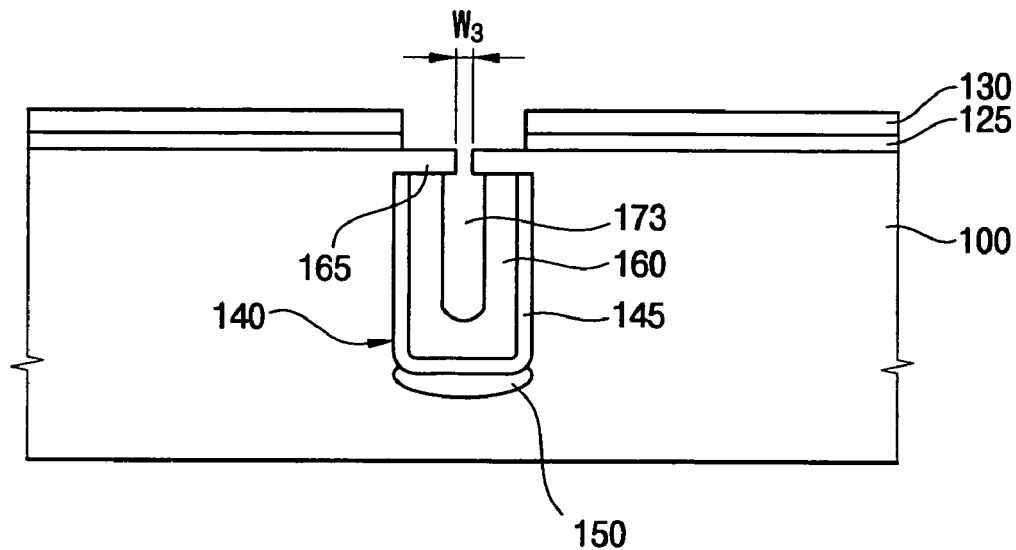

Referring to FIG. 2G, the epitaxial silicon layer 165 grows from the exposed portion of the inner sidewall of the deep trench 140 in a direction parallel to the semiconductor substrate 100. The epitaxial silicon layer 165 is formed by a selective epitaxial growth (SEG) process. The epitaxial silicon layer 165 may have a width of about 0.4 to about 0.6 μm. For example, the epitaxial silicon layer 165 has a width of about 0.5 μm. Because the epitaxial silicon layer 165 is grown from the exposed portion of the inner sidewall of the deep trench 140 in the direction parallel to the semiconductor substrate 100, an upper portion of the deep trench 140 has a third width $W_3$ less than the second width $W_2$. That is, since the epitaxial silicon layer 165 grows from the exposed portion of the substrate 100 to have the width of about 0.4 to about 0.6 μm, the second width $W_2$ of the deep trench 140 decreases by twice the width of the epitaxial silicon layer 165. Thus, the upper portion of the deep trench 140 has the third width $W_3$ about 0.1 to about 0.3 μm reduced by twice the width of the epitaxial silicon layer 165. For example, the third width $W_3$ of the deep trench 140 is about 0.2 μm. Thus, a ratio between the first width $W_1$ and the third width $W_3$ may be in a range of about 1.0:0.05 to 0.22. For example, the ratio of the third width $W_3$ relative to the first width $W_1$ is about 0.13:1.0.

The third width $W_3$ of the upper portion of the deep trench 140 may decrease in accordance with the formation of the epitaxial silicon layer 165 on the upper portion of the inner sidewall of the deep trench 140 in the direction parallel to the semiconductor substrate 100. When a third oxide layer 170 (see FIG. 2H) is formed on the deep trench 140, the third oxide layer 170 does not completely fill up the deep trench 140 because the upper portion of the deep trench 140 has the narrow width $W_3$. As a result, a void 175 having a wide width corresponding to the second width $W_2$ is formed in the deep trench 140.

Referring now to FIG. 2G, because the epitaxial layer 165 grows from the exposed upper portion of the inner sidewall of the deep trench 140, the upper portion of the deep trench 140 is partially closed so that an opening 173 is formed in the deep trench 140. The opening 173 may have a width substantially identical to the second width $W_2$.

Figure 2H:
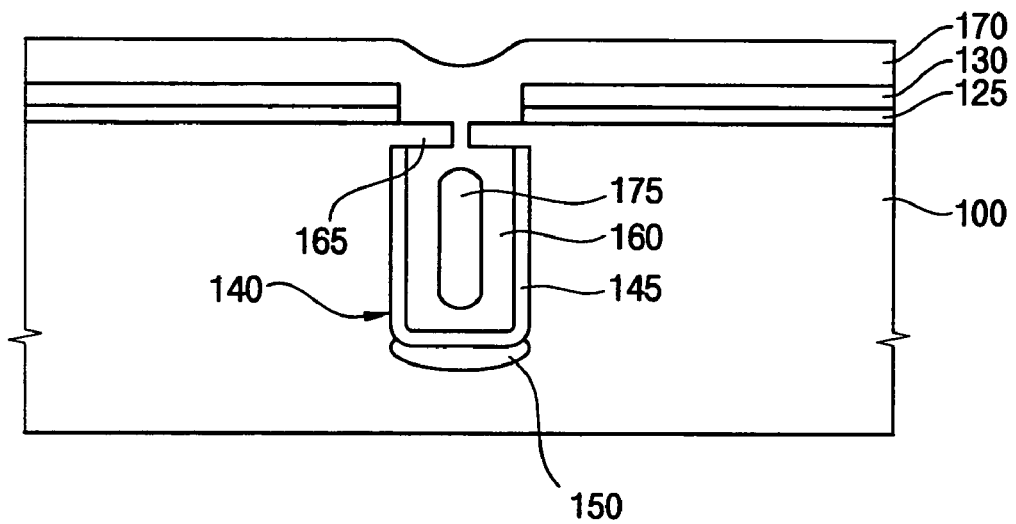

Referring to FIG. 2H, the third oxide layer 170 is formed on the first nitride layer pattern 130 and on the epitaxial layer 165. Here, the third oxide layer 170 is also formed on the deep trench 140 having the reduced third width $W_3$. The third oxide layer 170 may have a thickness of about 0.2 to about 0.6 μm measured from an upper face of the first nitride layer pattern 130 by a chemical vapor deposition process, a plasma enhanced chemical vapor deposition process or a high density plasma chemical vapor deposition process. For example, the third oxide layer 170 having a thickness of about 0.4 μm is formed by the high density plasma chemical vapor deposition process. Because the upper portion of the trench 140 has the third width $W_3$, the third oxide layer 170 is not formed to a lower portion of the opening 173. Since the third oxide layer 170 may be formed on and beneath the epitaxial layer 165, the opening 173 is partially closed by the third oxide layer 170. That is, an upper portion of the opening 173 is closed in accordance with the third oxide layer 170 that is partially formed in the deep trench 140. Therefore, the void 175 having the wide width is formed in the deep trench 140.

Figure 2I:
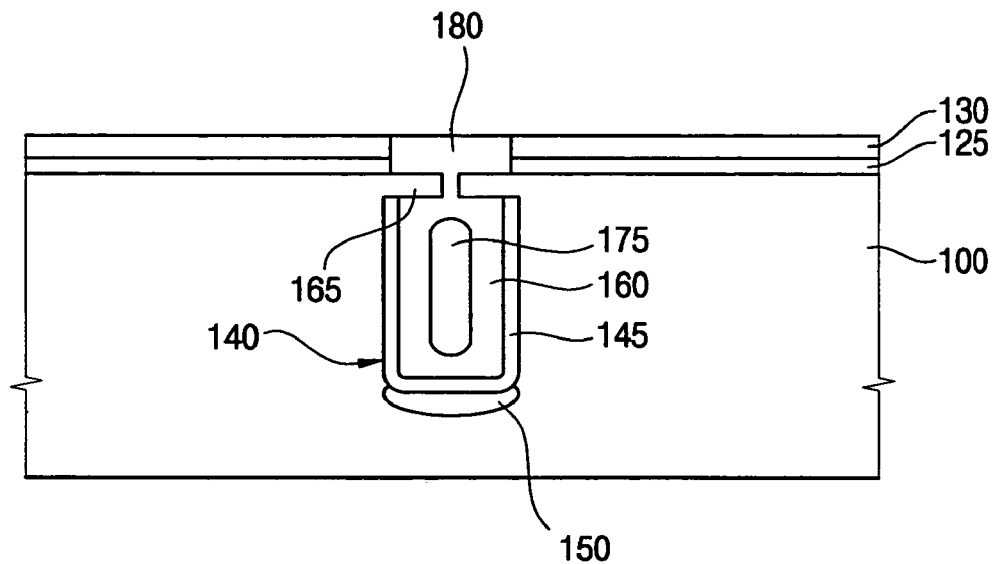

Referring to FIG. 2I, the third oxide layer 170 is partially removed until the first nitride layer pattern 130 is exposed to form a third oxide layer pattern 180 that covers the deep trench 140. The third oxide layer 170 may be removed by a chemical mechanical polishing (CMP) process, an etch back process or a combination process of CMP and etch back. When the third oxide layer pattern 180 is formed to cover the deep trench 140, the deep trench 140 having the wide void 175 is completed. That is, the wide void 175 is formed in the deep trench 140 and the deep trench 140 is covered with the second nitride layer pattern 160 and the third oxide layer pattern 180.

Figure 2J:
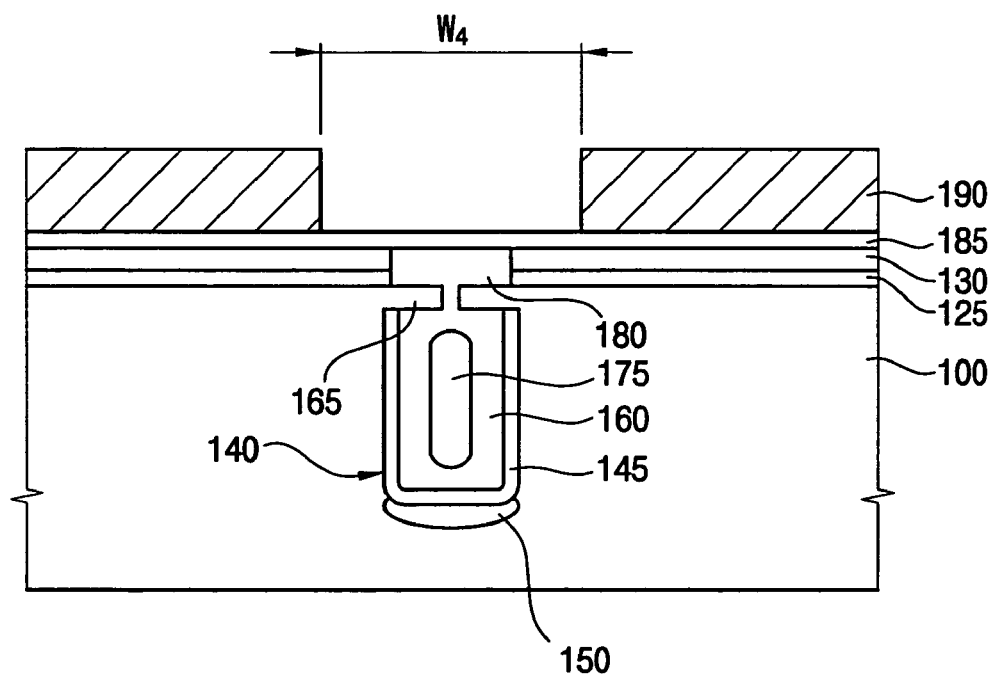

Referring to FIG. 2J, to form a shallow trench 200 (referred to as a second trench) on the deep trench 140, an anti reflective layer (ARL) 185 is formed on the third oxide layer pattern 180 and the first nitride layer pattern 130. The ARL 185 may be formed using silicon oxide, silicon nitride or silicon oxynitride so that the ARL 185 has a thickness of about 500 to about 600 Å measured from an upper face of the third oxide layer pattern 180. For example, the ARL 185 has a thickness of about 550 Å.

A second photoresist pattern 190 for forming the shallow trench 200 is formed on the ARL 185. The second photoresist pattern 190 has an opening that exposes a portion of the ARL 186 by a width $W_4$. Hence, the shallow trench 200 also has the width $W_4$ be in accordance with the opening of the second photoresist pattern 190. The shallow trench 200 may have the width $W_4$ in a range of about 1.6 to about 2.0 μm. For example, the shallow trench 200 has the width $W_4$ of about 1.8 μm. Therefore, the ratio of the width $W_4$ of the shallow trench 200 relative to the first width $W_1$ of the deep trench 140 may be in a range of about 1:1.0 to 1.5. For example, the ratio between the width $W_4$ of the shallow trench 200 and the first width $W_1$ of the deep trench 140 is about 1:1.2.

Figure 2K:
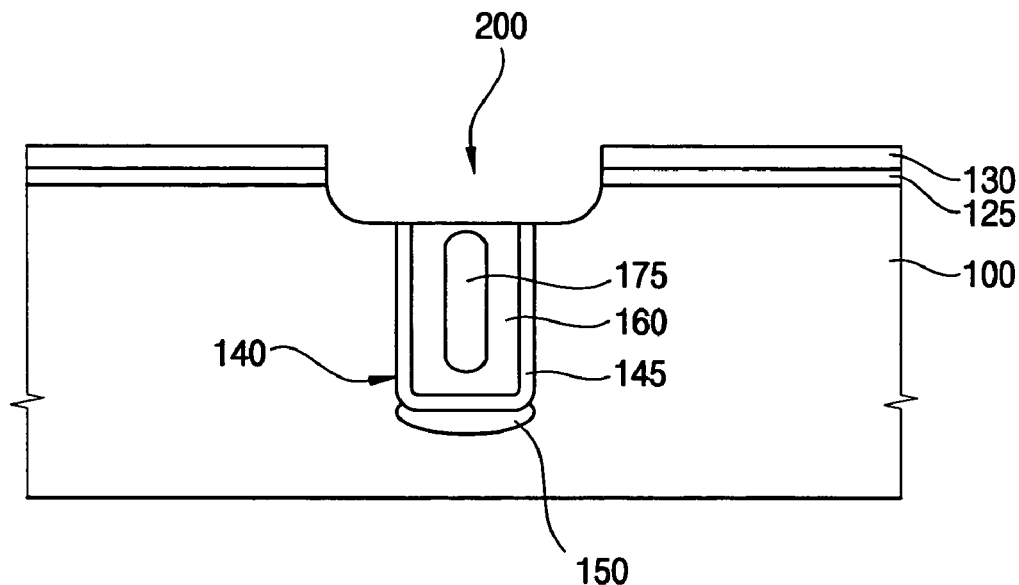

Referring to FIG. 2K, the first nitride layer pattern 130, the third oxide layer pattern 180, the pad oxide layer pattern 125, the epitaxial silicon layer 165 and an upper portion of the substrate 100 are partially etched using the second photoresist pattern 190 as an etching mask, thereby forming the shallow trench 200 on the deep trench 140. The shallow trench 200 may be formed by an isotropic etching process. The shallow trench may have a depth of about 3,000 to about 5,000 Å measured from the upper face of the semiconductor substrate 100. For example, the shallow trench 200 has a depth of about 4,000 Å measured from the upper face of the semiconductor substrate 100. The depth D of the deep trench 140 is more than about 8 μm, whereas the depth of the shallow trench 200 is about 3,000 to about 5,000 Å. Thus, the ratio between the depth D of the deep trench 140 relative to the depth of the shallow trench 200 is about 1:0.04 to 0.07. For example, the ratio between the depth D of the deep trench 140 and the depth of the shallow trench 200 is about 1:0.05. Namely, the shallow trench 200 has the depth of about 4 to about 7% of the depth D of the deep trench 140. Additionally, the ratio of the depth of the shallow trench 200 relative to the width $W_4$ thereof may be about 0.1 to 0.3:1.0. For example, the ratio between the depth of the shallow trench 200 and the width $W_4$ of the shallow trench 200 is about 0.2:1.0.

The second photoresist pattern 190 and the ARL 185 are removed from the shallow trench 200 by an ashing process and/or a stripping process.

Figure 2L:
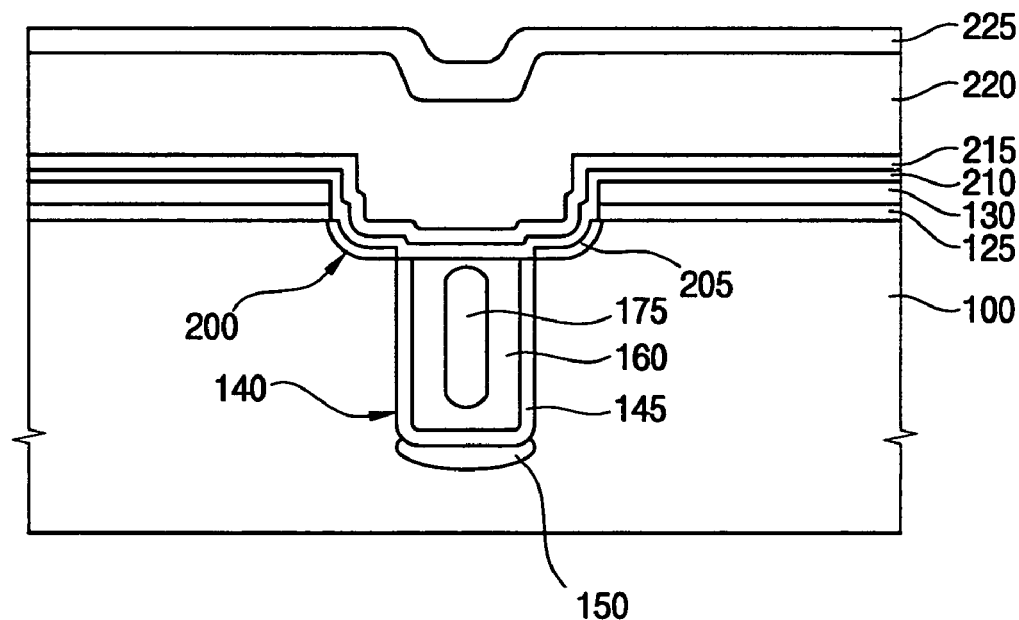

Referring to FIG. 2L, a fourth oxide layer pattern 205 is formed on an inner sidewall of the shallow trench 200 by a thermal oxidation process. That is, an exposed upper portion of the substrate 100 is oxidized to thereby form the fourth oxide layer pattern 205 having a thickness about 90 to about 130 Å. For example, the fourth oxide layer pattern 205 has a thickness of about 110 Å. Because the third oxide layer pattern 180 covers the upper portion of the deep trench 140, the fourth oxide layer pattern 205 is not formed on the upper portion of the deep trench 140. That is, the fourth oxide layer pattern 205 is selectively formed on the inner sidewall of the shallow trench 200.

A third nitride layer 210 and a fifth oxide layer 215 are sequentially formed on the upper portion of the deep trench 140, the fourth oxide layer pattern 205 and the first nitride layer pattern 130. The third nitride layer 210 may be formed using silicon nitride so that the third nitride layer 210 has a thickness of about 50 to about 90 Å measured from an upper face of the fourth oxide layer pattern 205. For example, the thickness of the third nitride layer 210 is about 70 Å. The fifth oxide layer 215 may be formed using middle temperature oxide (MTO) to have a thickness of about 80 to about 120 Å measured from an upper face of the third nitride layer 210. For example, the thickness of the fifth oxide layer 215 is about 100 Å measured from the upper face of the third nitride layer 210.

A sixth oxide layer 220 and a seventh oxide layer 225 are successively formed on the fifth oxide layer 215 to fill up the shallow trench 200 may be formed by a HDP-CVD process to have a thickness of about 5,000 to about 9,000 Å. For example, the thickness of the sixth oxide layer 220 is about 7,000 Å. The seventh oxide layer 225 may be formed using tetraethylorthosilicate (TEOS) by a plasma enhanced chemical vapor deposition process to have a thickness of about 2,000 to about 4,000 Å. For example, the seventh oxide layer 225 has a thickness of about 3,000 Å.

The sixth and seventh oxide layers 220 and 225 are thermally treated at a temperature of about 1,000 to about 1,100° C. for about 40 to about 80 minutes under an inactive atmosphere. That is, sixth and seventh oxide layers 220 and 225 are thermally treated using an inactive gas such as a nitrogen gas ($N_2$) or an inert gas. For example, the sixth and seventh oxide layers 220 and 225 are annealed at a temperature of about 1,050° C. for about 60 minutes under an inactive atmosphere including a nitrogen gas.

Figure 2M:
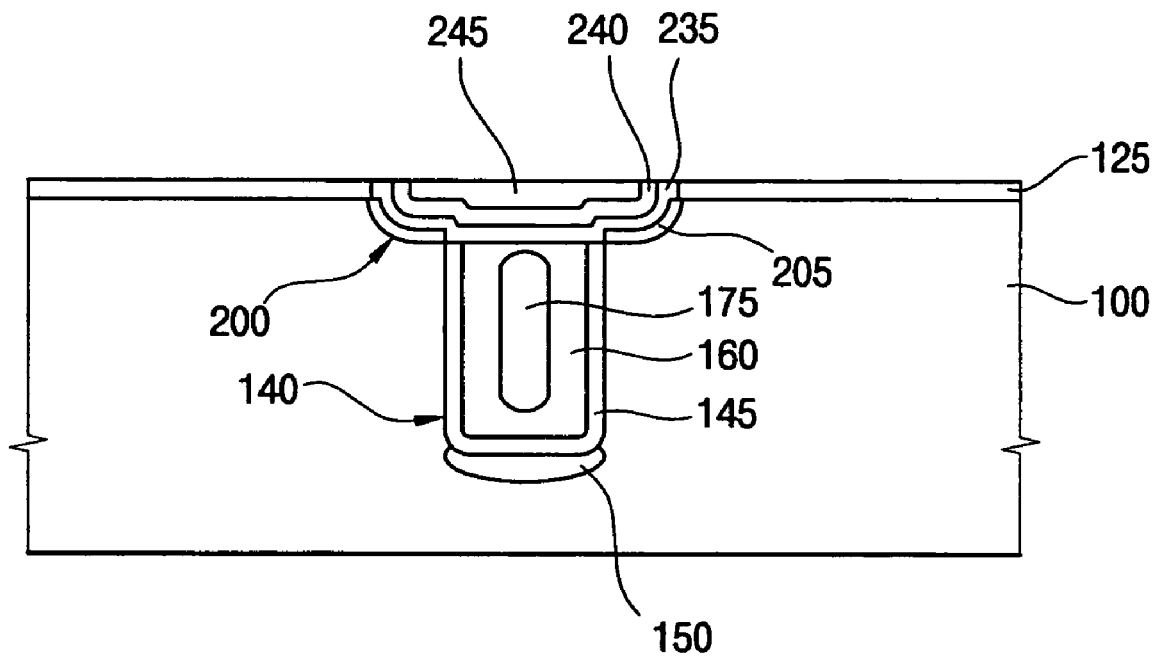

Referring to FIG. 2M, the seventh oxide layer 225, the sixth oxide layer 220, the fifth oxide layer 215, the third nitride layer 210 and the first nitride layer pattern 130 are partially removed by a chemical mechanical polishing process until the pad oxide layer 125 is exposed. Hence, the shallow trench 200 is filled with a third nitride layer pattern 235, a fifth oxide layer pattern 240 and a sixth oxide layer pattern 245. As a result, there is formed a trench structure that includes the deep trench 140 having a void 175 and the shallow trench 200 formed on the deep trench 140.

Hereinafter, a method of manufacturing an inductor including the trench structure will be described.

Figure 3:
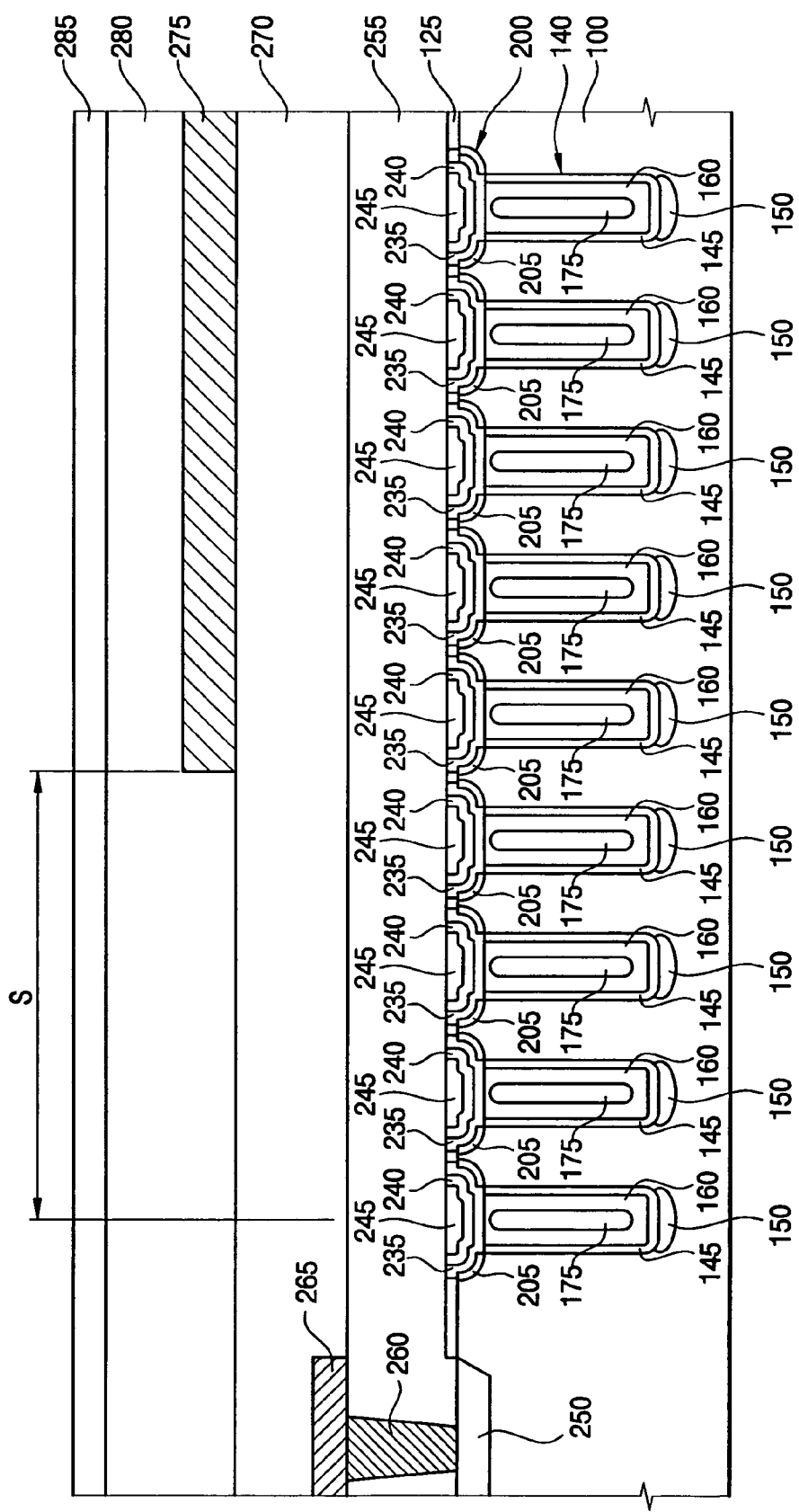
FIG. 3 is a cross sectional view illustrating an inductor including a trench structure having a wide void in accordance with one embodiment of the present invention.

FIG. 3 is a cross sectional view illustrating an inductor including a trench structure having a wide void in accordance with one embodiment of the present invention. In the present embodiment, processes for forming deep trenches 140 and shallow trenches 200 on a semiconductor substrate 100 are substantially identical to those described with reference to FIGS. 2A to 2M. To form an inductor on the semiconductor substrate 100, a plurality of the deep trenches 140 having wide voids 175 therein and a plurality of the shallow trenches 200 disposed on the deep trenches 140 are formed on the semiconductor substrate 100.

Referring to FIG. 3, impurities are ion implanted into a portion of the semiconductor substrate 100 by an ion implantation process to form a contact region 250. The contact region 250 is formed at the portion of the substrate 100 adjacent to the deep trenches 140 and the shallow trenches 200. When the semiconductor substrate 100 is a P type silicon substrate, elements in Group V are implanted into the portion of the substrate 100 as the impurities so that the contact region 250 has a P$^+$ type. Alternatively, the contact region 250 is formed before forming the deep trenches 140. Further, after the deep trenches 140 are formed, the contact region 250 is formed before forming the shallow trenches 200.

A first insulating interlayer 225 is formed on the substrate 100 having the contact region 250. The first insulating interlayer 255 may be formed using an oxide such as TEOS by a PE-CVD process. An upper portion of first insulating interlayer 255 may be planarized by a CMP process, an etch back process or a combination process of CMP and etch back. The first insulating interlayer 255 is partially etched to form a contact hole (not shown) that exposes the contact region 250.

A first conductive layer (not shown) is formed on the first insulating interlayer 255 to fill up the contact hole. The first conductive layer may include a conductive material such as metal or polysilicon doped with impurities. Then, the first conductive layer is partially removed by a CMP process, an etch back process or a combination process of CMP and etch back until the first insulating interlayer 255 is exposed. As a result, a contact 260 filling up the contact hole is formed on the contact region 250. That is, the contact 260 makes contact with the contact region 250.

A second conductive layer (not shown) is formed on the first insulating interlayer 255 where the contact 260 is formed. The second conductive layer is etched by a photolithography process to form a conductive pattern 265 that makes contact with the contact 260. The conductive pattern 265 serving as a pad or a conductive wiring may include a conductive material such as metal or doped polysilicon.

A second insulating interlayer 270 is formed on the conductive pattern 265 and the first insulating interlayer 255. The second insulating interlayer 270 may be formed using an oxide such as TEOS. An upper portion of the second insulating interlayer 270 may be planarized by a CMP process, an etch back process or a combination process of CMP and etch back.

In one embodiment of the present invention, the processes for forming the second insulating interlayer 270 on the first insulating interlayer 255 may be repeated several times, thereby forming a plurality of insulating interlayers, a plurality of contacts through the insulating interlayers and a plurality of conductive pads contacting the contacts over the substrate 100.

Referring now to FIG. 3, a third conductive layer (not shown) is formed on the second insulating interlayer 270. The third conductive layer is etched to form a conductive line 275. The conductive line 275 may include a conductive material such as doped polysilicon or metal like copper (Cu), platinum (Pt), palladium (Pa), nickel (Ni) or silver (Ag). The conductive line 275 of the inductor typically has a spiral structure. Here, the conductive line 275 may have a thickness of about 16,000 to about 24,000 Å. For example, the thickness of the conductive line 275 is about 20,000 Å. Because the resistance of the conductive line 275 may be reduced in proportion to the thickness thereof, the quality factor of the inductor may also be improved in proportion to the thickness of the conductive line 275. Thus, the conductive line 275 may advantageously have thick thickness. An interval S between the conductive line 275 and the adjacent deep trench 140 or the shallow trench 200 is in a range of about 30 to about 70 μm. For example, the interval S is about 50 μm. The ratio between the depth of the deep trench 140 and the interval S of the conductive line 275 relative to the adjacent deep or shallow trench 140 or 200 may be in range of about 1:3 to 9. For example, the ratio of the depth of the deep trench 140 relative to the interval S is about 1:6.3. The contact 260 or the conductive pattern 265 may serve as a ground pad when the characteristics of the inductor are measured in a high frequency band.

An additional oxide layer 280 and an additional nitride layer 285 are formed on the conductive line 275 to complete the inductor on the substrate 100. The additional oxide layer 280 and the nitride layer 285 serve as protection layers. However, the additional oxide layer 280 and the additional nitride layer 285 are optional are not required, depending on the application.

Figure 4A:
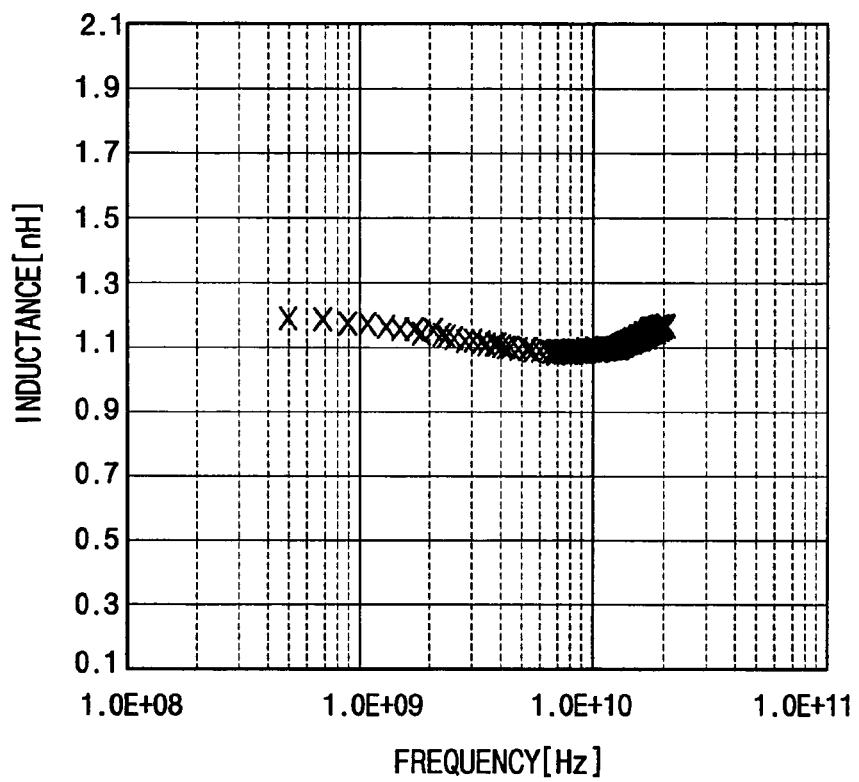
FIGS. 4A to 4C are graphs illustrating the inductances of inductors as a function of signal frequency in accordance with the present invention.
Figure 4B:
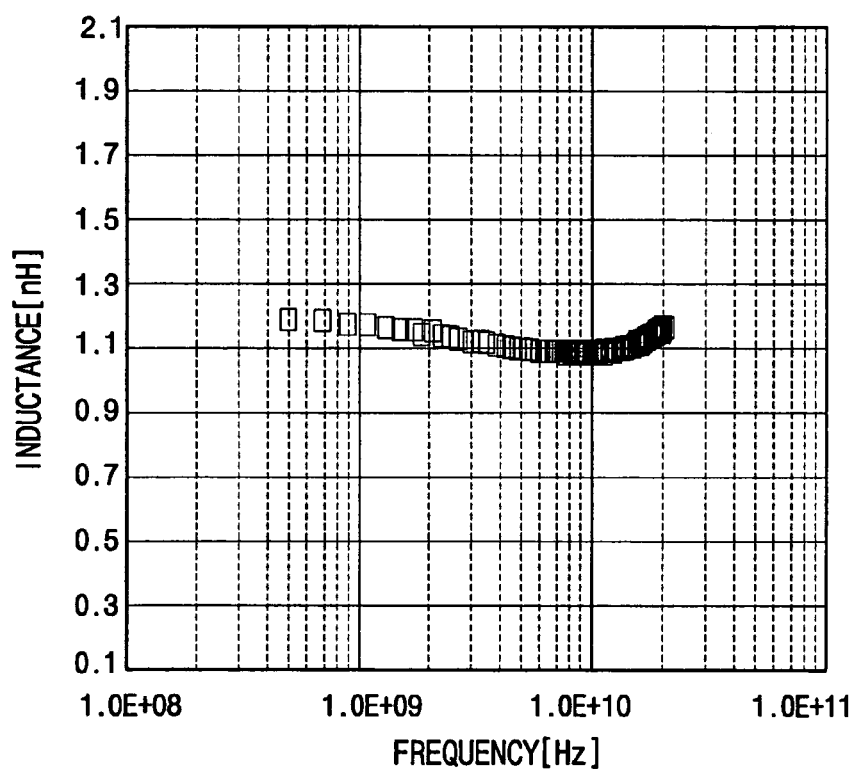
Figure 4C:
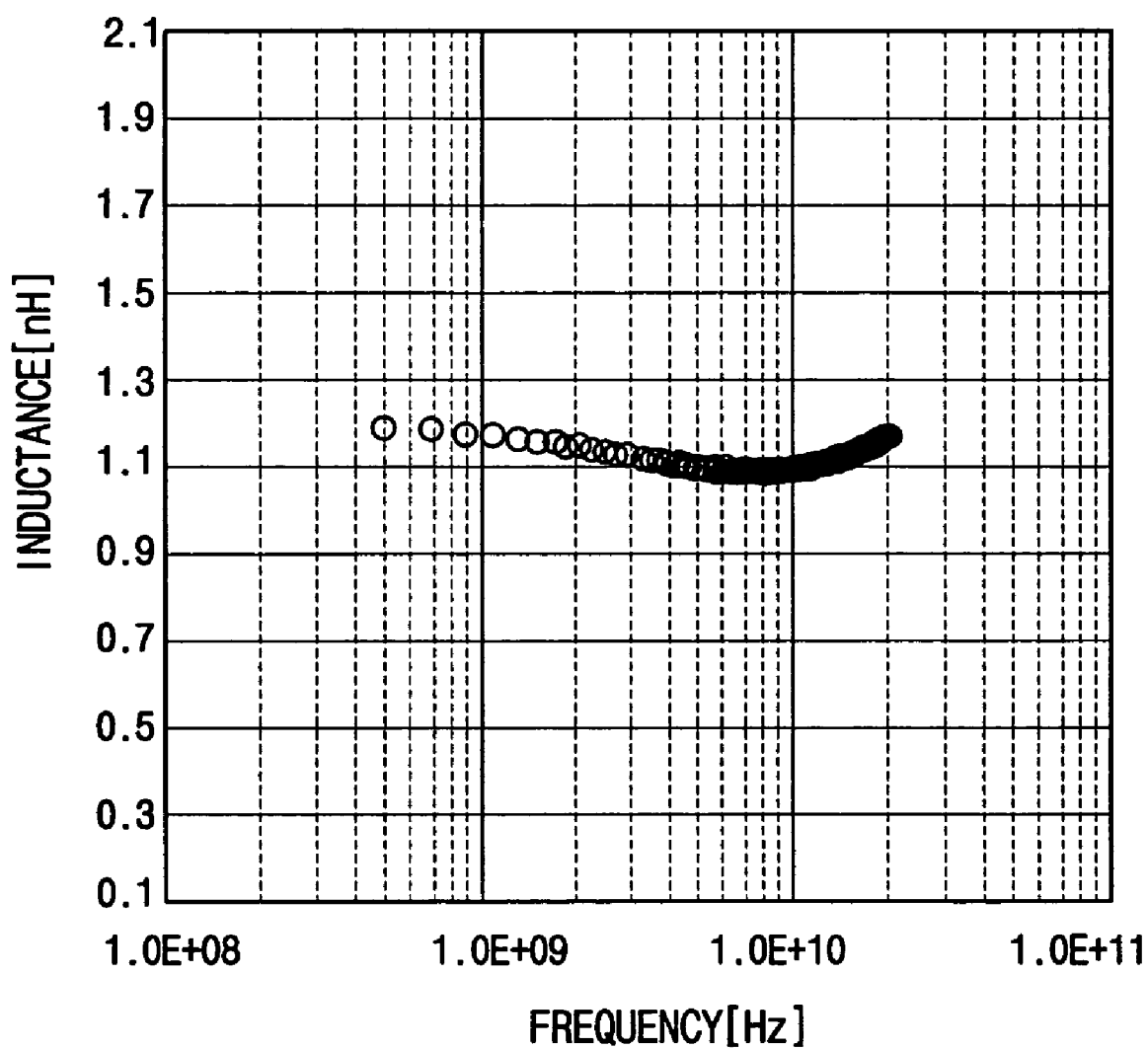

FIGS. 4A to 4C are graphs illustrating the inductances of inductors relative to frequencies in accordance with the structures of trenches included in the inductors. FIG. 4A shows the inductance of a first inductor formed on a semiconductor substrate that does not have a trench. FIG. 4B shows the inductance of a second inductor formed on a semiconductor substrate including a trench that does not have a void therein. FIG. 4C shows the inductance of a third inductor formed on a semiconductor substrate including a trench that has a void therein. FIGS. 4A to 4C represent simulation results obtained by employing a high-frequency structure simulator (HFSS).

Referring to FIGS. 4A to 4C, when the first inductor is formed on the semiconductor substrate that does not have the trench, the inductance of the first inductor is about 0.97 to about 1.2 nH at a high frequency band of about $5.0 \times 10^8$ to about $2.0 \times 10^{10}$ Hz. When the second inductor is formed on the semiconductor substrate including the trench that does not have the void therein, the inductance of the second inductor is about 0.97 to about 1.2 nH at a high frequency band of about $5.0 \times 10^8$ to about $2.0 \times 10^{10}$ Hz. In case that the third inductor is formed on the semiconductor substrate including the trench that has the wide void therein, the inductance of the third inductor is about 0.98 to about 1.2 nH at a high frequency band of about $5.0 \times 10^8$ to about $2.0 \times 10^{10}$ Hz. As shown in FIGS. 4A to 4C, the inductances of the first to third inductors do not exhibit substantial variance at the high frequency band in accordance with the structures of the trenches.

Figure 5:
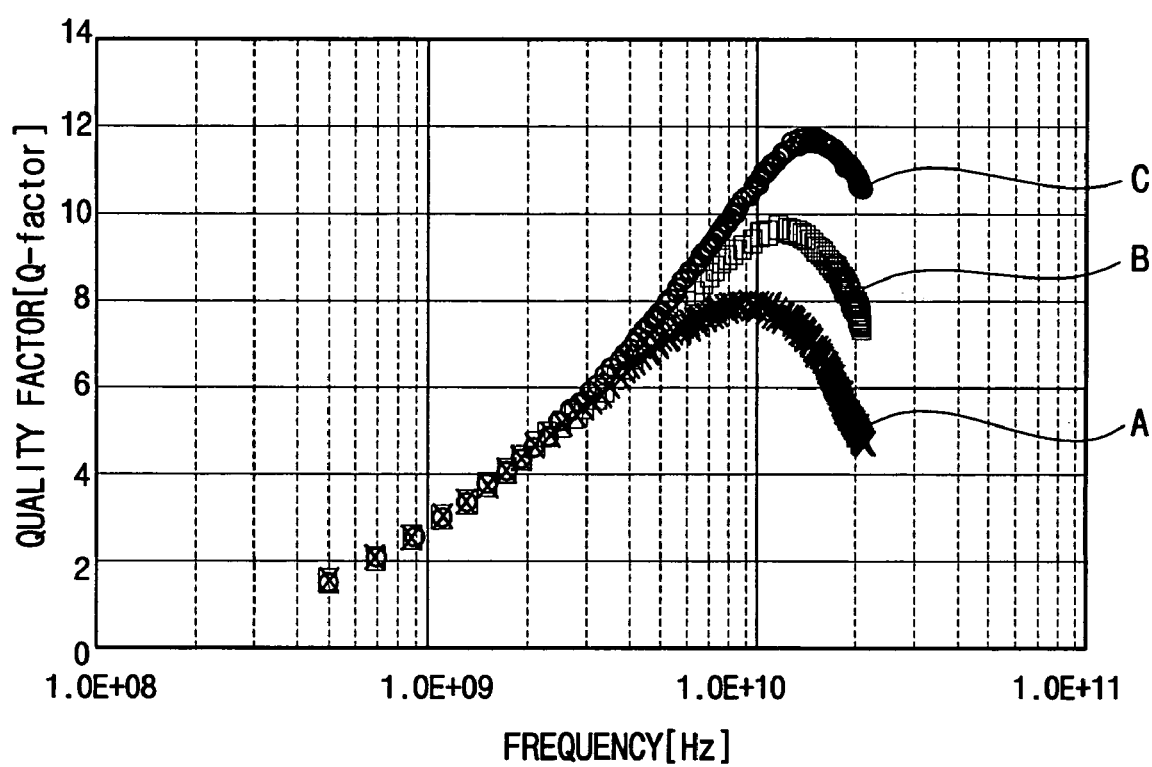
FIG. 5 is a graph illustrating the quality factors of inductors as a function of signal frequency in accordance with the present invention.

FIG. 5 is a graph illustrating the quality factors of inductors relative to frequencies in accordance with structures of the trenches included in the inductors. In FIG. 5, "A" line indicates the quality factor of a first inductor formed on a semiconductor substrate that does not include a trench, "B" line means the quality factor of a second inductor formed on a semiconductor substrate including a trench that is filled with oxide without a void therein, and "C" line represents the quality factor of a third inductor formed on a semiconductor substrate including a trench that has a void therein.

Referring to FIG. 5, when the first inductor is formed on the semiconductor substrate that does not include the trench, the quality factor A of the first inductor is about 1.5 to about 8.0 nH at a high frequency band of about $5.0 \times 10^8$ to about $2.0 \times 10^{10}$ Hz. In the case where the second inductor is formed on the semiconductor substrate including the trench that is filled with oxide without a void, the quality factor B of the second inductor is about 1.5 to about 10.0 nH at a high frequency band of about $5.0 \times 10^8$ to about $2.0 \times 10^{10}$ Hz. In the case where the third inductor is formed on the semiconductor substrate including the trench having the void therein, the quality factor C of the third inductor is about 1.5 to about 12.0 nH at a high frequency band of about $5.0 \times 10^8$ to about $2.0 \times 10^{10}$ Hz. Therefore, the third inductor formed over the trench including the void exhibits an improved quality factor as compared to the first and second inductors. Particularly, the quality factor A of the first inductor is about 4.5 nH at a high frequency band of more than about $1.0 \times 10^{10}$ Hz, and the quality factor B of the second inductor is about 7 nH at a high frequency band of more than about $1.0 \times 10^{10}$ Hz. However, the quality factor C of the third inductor is about 11 nH at a high frequency band of more than about $1.0 \times 10^{10}$ Hz. Because the third inductor of the present invention has the quality factor C of about 11 nH at the high frequency band of above about $1.0 \times 10^{10}$ Hz, the quality factor C of the third inductor in this example realizes an improvement of more than about 50 to about 100% in quality factor, relative to the quality factors of the conventional inductors.

Additionally, the maximum quality factor A of the first inductor is about 8.0 nH and the maximum quality factor B of the second inductor is about 10.0 nH. However, the maximum quality factor C of the third inductor of the present invention is about 12 nH. Thus, the maximum quality factor of the third inductor in this example is improved by more than about 20 to about 50% relative to those of the conventional inductors.

According to the present invention, a deep trench having a wide void therein is formed on a substrate by a selective epitaxial growth (SEG) process. For example, the deep trench has a depth of more than about 8 μm. Since an inductor is formed over the substrate where a trench structure including a plurality of the deep trenches and a plurality of shallow trenches is formed, the inductor realizes an improved quality factor. Particularly, the inductor realizes a greatly improved quality factor in a high frequency band. Additionally, the quality factor of the inductor is maximized by advantageously adjusting an interval between the trench structure and the inductor.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A method of forming a trench structure comprising:
   forming a deep trench having a first width and a first depth on a substrate, wherein forming the deep trench comprises:
   forming a pad oxide layer pattern on the substrate;
   forming a first nitride layer pattern on the pad oxide layer pattern;
   forming a first oxide layer pattern on the first nitride layer pattern;
   partially etching the substrate using the first oxide layer pattern, the first nitride layer pattern and the pad oxide layer pattern as etching masks; and
   removing the first oxide layer pattern;
   forming an enclosed void in the deep trench by filling the deep trench with a first insulation layer pattern in a manner that defines the enclosed void in the deep trench,
   wherein forming the enclosed void in the deep trench comprises:
   forming a second oxide layer pattern on a sidewall of the deep trench;
   forming a second nitride layer pattern on the second oxide layer pattern to form an opening in the deep trench; and
   forming a third oxide layer pattern on the second nitride layer pattern to complete the enclosed void by covering a top portion of the opening;
   forming a shallow trench on the deep trench, the shallow trench having a second width substantially wider than the first width and a second depth substantially shallower than the first depth; and
   filling up the shallow trench with a second insulation layer pattern.

2. The method of claim 1, further comprising forming a channel stop region at a portion of the substrate beneath the deep trench.

3. The method of claim 2, wherein the channel stop region is formed using elements in Group III as impurities.

4. The method of claim 1, wherein forming the enclosed void in the deep trench further comprises:
   forming a second nitride layer on the second oxide layer pattern and the first nitride layer pattern;
   over-etching the second nitride layer to form the second nitride layer pattern that partially exposes a portion of the substrate;
   forming an epitaxial silicon layer from the exposed portion of the substrate;
   forming a third oxide layer on the epitaxial silicon layer and the second nitride layer pattern; and
   etching the third oxide layer to form the third oxide layer pattern that covers a top portion of the opening.

5. The method of claim 4, wherein the second nitride layer is etched by an etch back process and the third oxide layer is etched by a chemical mechanical polishing process.

6. The method of claim 4, wherein the epitaxial silicon layer grows from the exposed portion of the substrate in a direction parallel to the substrate so that the opening is partially closed by the epitaxial silicon layer.

7. The method of claim 4, wherein forming the shallow trench comprises:
   forming a second photoresist pattern on the third oxide layer pattern and the first nitride layer pattern; and
   partially etching the first nitride layer pattern, the third oxide layer pattern, the pad oxide layer pattern, the epitaxial silicon layer and the substrate using the second photoresist pattern as an etching mask.

8. The method of claim 7, further comprising forming an anti reflective layer between the third oxide layer pattern and the second photoresist pattern and between the first nitride layer pattern and the second photoresist pattern.

9. The method of claim 7, wherein filling up the shallow trench with the second insulation layer pattern comprises:

forming a fourth oxide layer pattern on a sidewall of the shallow trench;

forming a third nitride layer pattern on the fourth oxide layer pattern and the third oxide layer pattern;

forming a fifth oxide layer pattern on the third nitride layer pattern; and forming a sixth oxide layer pattern on the fifth oxide layer pattern to fill up the shallow trench.

10. The method of claim 9, wherein filling up the shallow trench with the second insulation layer pattern further comprises:

sequentially forming a third nitride layer, a fifth oxide layer, a sixth oxide layer and a seventh oxide layer on the fourth oxide layer pattern and the third oxide layer pattern; and etching the seventh oxide layer, the sixth oxide layer, the fifth oxide layer and the third nitride layer until the pad oxide layer pattern is exposed to form the third nitride layer pattern, the fifth oxide layer pattern and the sixth oxide layer pattern in the shallow trench.

11. The method of claim 1, wherein forming the deep trench further comprises:

sequentially forming a pad oxide layer, a first nitride layer and a first oxide layer on the substrate;

forming a first photoresist pattern on the first oxide layer, the first photoresist pattern including an opening having the first width, through which the first oxide layer is partially exposed; and sequentially etching the first oxide layer, the first nitride layer and the pad oxide layer using the first photoresist pattern as an etching mask to form the pad oxide layer pattern, the first nitride layer pattern and the first .oxide layer pattern on the substrate.

* * * * *